United States Patent
Lin et al.

(10) Patent No.: US 7,035,770 B2
(45) Date of Patent: Apr. 25, 2006

(54) FUZZY REASONING MODEL FOR SEMICONDUCTOR PROCESS FAULT DETECTION USING WAFER ACCEPTANCE TEST DATA

(75) Inventors: Shuo-Huei Lin, Hsin-Chu (TW); Ruenn-Sheng Peng, Hsin-Chu (TW); Yi-Ju Chen, Taipei (TW); Kuo-Rung Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 10/739,857

(22) Filed: Dec. 18, 2003

(65) Prior Publication Data

US 2005/0137736 A1 Jun. 23, 2005

(51) Int. Cl.
*G06F 15/00* (2006.01)

(52) U.S. Cl. ...................................... 702/185; 702/182

(58) Field of Classification Search ............. 324/76.11, 324/500, 765; 438/14, 16, 17, 800; 700/90, 700/95, 96, 104, 108, 109, 110, 117, 121; 702/33, 35, 57, 58, 81–84, 108, 117, 118, 702/127, 182, 183, 185, 188, 179, 189; 714/25, 714/47, 48; 716/4, FOR 489, FOR 490
See application file for complete search history.

(56) References Cited

U.S. PATENT DOCUMENTS

| | | | |
|---|---|---|---|
| 4,924,408 A | 5/1990 | Highland | |
| 4,935,876 A | 6/1990 | Hanatsuka | |
| 5,548,714 A | 8/1996 | Becker | |
| 5,923,553 A * | 7/1999 | Yi | 700/110 |
| 6,028,994 A | 2/2000 | Peng et al. | |
| 6,240,329 B1 * | 5/2001 | Sun | 700/110 |
| 6,274,394 B1 * | 8/2001 | Cha | 438/14 |
| 6,766,208 B1 * | 7/2004 | Hsieh | 700/109 |
| 2002/0022937 A1 * | 2/2002 | Funakoshi | 702/84 |

OTHER PUBLICATIONS

Chih-Min Fan; Ruey-Shan Guo; Shi-Chung Chang; "EWMA/SD: an End-of-line SPC scheme to Monitor Sequence-Disorderd Data": 2nd International Workshop on Statitical Metrology Proceedings; Jun. 8, 1997; pp 66-69.*
Chih-Min Fan; Ruey-Shan Guo; Chen, A; Kuo-Ching Hsu; Chih-Shih Wei; "Data Mining and Fault Diagnosis Based on Wafer Acceptance Test Data and In-Line Manufacturing Data"; IEEE International Semiconductor Manufacturing Symposium; Oct. 8-10, 2001; pp 171-174.*

(Continued)

*Primary Examiner*—Michael Nghiem
*Assistant Examiner*—Douglas N Washburn
(74) *Attorney, Agent, or Firm*—Slater & Matsil, L.L.P.

(57) ABSTRACT

System and method for detecting suspicious process faults. A preferred embodiment comprises determining a strength relationship between wafer acceptance test (WAT) parameters and process steps. The strength relationships indicate the affect of a failed process step on the value of a WAT parameter. Thus, if a WAT parameter is not within the parameters set in the WAT, then the suspicious process steps that caused the failure are the process steps that had a strength relationship with the failed WAT parameter. Furthermore, in a preferred embodiment, negative inferences are determined and utilized to determine a degree of suspiciousness. The degree of suspiciousness is used to determine a total degree of suspiciousness.

32 Claims, 3 Drawing Sheets

OTHER PUBLICATIONS

Ferhatosmanoglu, H; Tuncel, E; Agrawal, D; El Abbadi, A; "Approximate Nearest Neighbor Searching in Multimedia Databases" Proceedings 17th International Conference on Data Engineering; Apr. 2-6, 2001; pp 503-511)(Hereafter referred to as Ferhatosmanoglu.*

Chih-Min Fan; Ruey-Shan Guo; Shi-Chung Chang; Chih-Shih Wei; "SHEWMA:an end-of-line SPC scheme using wafer acceptance test data": IEEE Transactions on Semiconductor Manufacturing; vol. 13, Issue 3; Aug. 2000; pp 344-358.*

Chih-Min Fan; Ruey-Shan Guo; Shi-Chung Chang; Hui-Hung Kung; Jyh-Cheng You; Hsin-Pai Chen; Lin s; Chih-Shih Wei;"SHEWMAC: an End-of-line SPC scheme via Exponentially Weighted Moving Statistics": Semiconductor Manufacturing Technology Workshop: 14-15 Jun. 2.*

Chih-Min Fan; Ruey-Shan Guo; Shi-Chung Chang; Hui-Hung Kung; Jyh-Cheng You; Hsin-Pai Chen; Lin S; Chih-Shih Wei; "SHEWMAC: an End-of-line SPC scheme for Joint Monitoring of Process Mean and Variance"; IEEE Symposium on Semiconductor Manufacturing Conferenc.*

* cited by examiner

|  | PROCESS STEP 1 | PROCESS STEP 2 | PROCESS STEP 3 | PROCESS STEP 4 | PROCESS STEP 5 |
|---|---|---|---|---|---|
| WAT1 | 3 |  |  | 4 |  |
| WAT2 | 3 | 3 |  |  |  |
| WAT3 | 4 |  |  |  | 3 |
| WAT4 |  | 3 | 5 |  |  |
| WAT5 |  |  |  | 3 | 4 |
| WAT1_H |  |  | 4 |  | 5 |
| WAT1_H AND WAT2_L | 3 | 3 |  | 3 |  |
| WAT3_H AND WAT1_L |  | 2 |  | 2 | 4 |

|  | PROCESS STEP 1 | PROCESS STEP 2 | PROCESS STEP 4 |
|---|---|---|---|
| WAT1 | 3 |  | 4 |
| WAT2 | 3 | 3 |  |
| WAT1_H AND WAT2_L | 3 | 3 | 3 |
| MAX(bad_weighting) | 3 | 3 | 4 |

|  | PROCESS STEP 1 | PROCESS STEP 2 | PROCESS STEP 4 |
|---|---|---|---|
| WAT3 | 4 |  |  |
| WAT4 |  | 3 |  |
| WAT5 |  |  | 3 |
| WAT3_H AND WAT1_L |  | 2 | 2 |
| 712 — MAX(good_weighting) | 4 | 3 | - |

|  | PROCESS STEP 1 | PROCESS STEP 2 | PROCESS STEP 3 |
|---|---|---|---|
| MAX(bad_weighting) | 3 | 3 | 4 |
| MAX(good_weighting) | 4 | 3 | - |
| DOS | 0.4 | 0.5 | 0.9 |
| TDOS | 0.24 | 0.3 | 0.72 |

800 —

|  |  | PROCESS STEP 1 | PROCESS STEP 2 | PROCESS STEP 3 | PROCESS STEP 4 | PROCESS STEP 5 |
|---|---|---|---|---|---|---|
| 815 — WAT CLUSTER C01 | WAT1 | 1 | 3 | 0 | 0 | 5 |
|  | WAT2 | 1 | 2 | 0 | 0 | 4 |
| 820 — WAT CLUSTER C02 | WAT3 | 0 | 1 | 4 | 3 | 0 |
|  | WAT4 | 0 | 0 | 5 | 3 | 1 |

FUZZY REASONING MODEL FOR SEMICONDUCTOR PROCESS FAULT DETECTION USING WAFER ACCEPTANCE TEST DATA

TECHNICAL FIELD

The present invention relates generally to a system and method for semiconductor fabrication, and more particularly to a system and method for detecting faults in a semiconductor fabrication process via the use of wafer test data.

BACKGROUND

In semiconductor integrated circuit (IC) manufacturing, the ICs are created on wafers of varying sizes using complicated fabrication processes with a large number of process steps. When a fault is detected on the wafer (or IC), it is the job of a process engineer (or a group of process engineers) to detect the location of the process fault, diagnose a root cause, and to make necessary corrections. With the wafers continuing to get larger and larger and the fabrication processes getting more complex, the likelihood of a process fault(s) occurring on a wafer also increases.

Faults are normally detected on a wafer during acceptance testing of the wafer. Wafer acceptance testing usually involves the placement of electrical leads onto test pads located within the dice located on the wafer. The electrical leads perform specified tests on the die and report back various measurements. The measurements may then be evaluated so that process engineers or computer-based testing applications may decide upon the acceptance of the wafer.

The measurements taken by the electrical leads may be provided to a process engineer, who will analyze the data to determine if faults are present on the wafer. If faults are present on the wafer, the process engineer may be able to detect the location of the process in which the fault occurred (i.e., the particular process step in the fabrication process that caused the fault), diagnose a root cause, and make any necessary corrections.

Alternatively, the measurements may be provided to a computer-based testing application, such as a testing application with a built-in expert system, and the computer-based testing application may be able to detect the location of the process fault, diagnose a root cause, and suggest necessary corrections to remedy the situation. Should the semiconductor fabrication line be automated to a sufficient degree, the computer-based testing application may be able to automatically apply its corrections.

One disadvantage of the prior art is that the use of humans (process engineers) to detect, diagnose, and fix process faults may result in process faults that remain for a long time in the fabrication process after they are detected. This may be caused by inherent inefficiencies associated with humans who must study and discuss the measurements to decide upon an appropriate action. Additionally, process faults may be detected at a time when humans are not available, for example, at odd hours or on weekends. Therefore, time may be wasted prior to the process fault measurement data being examined.

An additional disadvantage of the prior art is that the expertise level of the process engineers can vary significantly between different users. Therefore, process faults may be mis-diagnosed by relatively inexperienced process engineers, who may also take a considerable amount of time.

A third disadvantage of the prior art is that the use of computer-based testing applications with built-in expert systems function only as well as the quality of the inference rules that are being used. The creation of the inference rules may require a large investment in time to interview experienced process engineers, something that the process engineers may not be willing to provide.

Yet another disadvantage of the prior art is that the use of computer-based testing applications with built-in expert systems often require many different rules be created for the different possible process failures. This can lead to a complex testing application that may be difficult to create and maintain.

SUMMARY OF THE INVENTION

These and other problems are generally solved or circumvented, and technical advantages are generally achieved, by preferred embodiments of the present invention which provides a method and apparatus for using wafer acceptance test data to detect and locate semiconductor process faults.

In accordance with a preferred embodiment of the present invention, a method and system for detecting suspicious process faults comprises creating a quality function deployment (QFD) knowledge base that indicates the strength relationship between the process steps and wafer acceptance test (WAT) parameters. Failed WAT parameters are used to detect suspicious process steps by indicating as suspicious any process step that affects the failed WAT parameter as identified in the QFD knowledge base. WAT parameters that have passed and that have a higher strength relationship with a suspicious process step are used as negative inferences. A total degree of suspiciousness is determined for each suspicious process step based at least upon the negative inferences and the strength relationship between failed WAT parameters and the corresponding process step.

An advantage of a preferred embodiment of the present invention is that a simple data table is used to maintain the technical knowledge of process engineers. The process engineers can readily provide their technical expertise via direct reasoning and not through precise numerical or statistical estimation. This permits the easy creation and maintenance of a computer-based testing application.

A further advantage of a preferred embodiment of the present invention is that process fault detection when multiple process faults occur simultaneously is possible through the use of a filter to separate and isolate process fault symptoms.

Yet another advantage of a preferred embodiment of the present invention is that only one reasoning algorithm is needed to provide process fault detection for an entire range of process faults, rather than requiring sets of complex inference rules for each possible process fault.

An additional advantage of a preferred embodiment of the present invention is that easy migration from one product technology to another can be easily and efficiently performed, requiring only small adjustments that are due to specific differences in the new product technology.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor fabrication plant. The invention may also be applied, however, to other manufacturing facilities wherein tests of the final product are made and the test data can be used to determine the presence of manufacturing faults along the manufacturing process.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
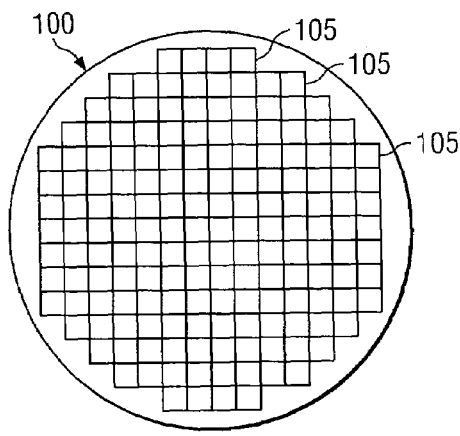
FIG. 1 is a diagram of a semiconductor wafer in accordance with an embodiment of the present invention.

With reference to FIG. 1, there is shown a figure illustrating an exemplary semiconductor wafer (or wafer for short) 100, wherein integrated circuits (IC) 105 have been created on the wafer 100. The fabrication of ICs on the wafer requires that the wafer 100 undergo a large number of relatively complex process steps, with potential process faults occurring at each process step. For example, a typical wafer that starts out being a virgin wafer may undergo the following process steps (though not necessarily limited to): deposition, masking, etching, doping, metallization, and passivation. Note that several of these steps may be repeated several times (on the order of five to seven or more times) during the fabrication process. Clearly, with such a large number of individual process steps and with some of them being quite complex in nature, process faults can occur at any time. Additionally, the handling of the wafers in between process steps can expose them to contamination and physical damage.

Figure 2:
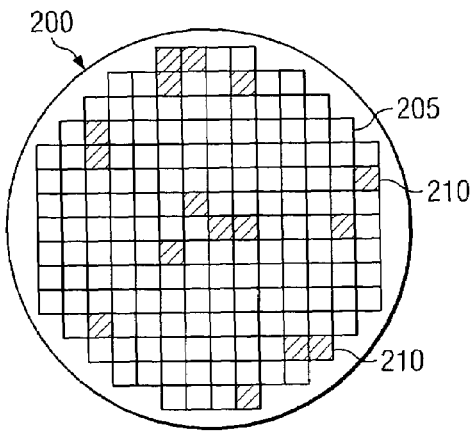
FIG. 2 is a diagram of a semiconductor wafer indicating the existence of faulty dice in accordance with an embodiment of the present invention.

FIG. 2 illustrates a wafer with damaged dice. Wafer 200, having encountered one or more process fault(s), contains damaged dice 210 dispersed throughout the wafer. Process faults may cause damage to a die or two on a wafer, a region of a wafer, or the entire wafer. When damage is localized to a die or a small region, the wafer may still be salvageable and a significant number of fully functional dice extracted from the wafer. However, if the process fault caused widespread damage to the wafer, the wafer is typically discarded.

The testing of the wafer after ICs have been fabricated on it may be performed on a test fixture. The test fixture holds a wafer while various probes are placed at different probe points dispersed throughout the wafer. The test fixture is part of a larger overall testing system that can be used to make a decision on whether or not to accept a completed wafer.

The damaged dice 210 would be detected during a testing phase of the fabrication process, wherein probes are placed at various points on the wafer and the functionality of the dice is tested. In some instances, each die is tested for function via a set of probe points that are placed on each of the die, with the same probe points being available on every die. If a faulty die is found during testing, the die is marked (usually by injecting ink onto the die) and will be discarded after it is cut from the wafer. In some instances, the entire wafer is tested for function via a set of probe points that are placed on the wafer.

Generally, tests are performed by taking predetermined measurements of various wafer acceptance test parameters (WAT parameters), such as resistance, current and the like. The WAT parameters may include measurements taken at the various probe points throughout the wafer and measurements taken during the fabrication of the wafer (such as process parameters measured by measurement equipment at various process steps). The values associated with the WAT parameters, referred to as wafer acceptance test data (WAT data) are compared with predetermined limits. If the values are within the predetermined limits, the measurements are said to be within specification and the test passes. Otherwise, if the values are not within the predetermined limits, then the measurements are said to be out of specification and the test fails.

Figure 3:
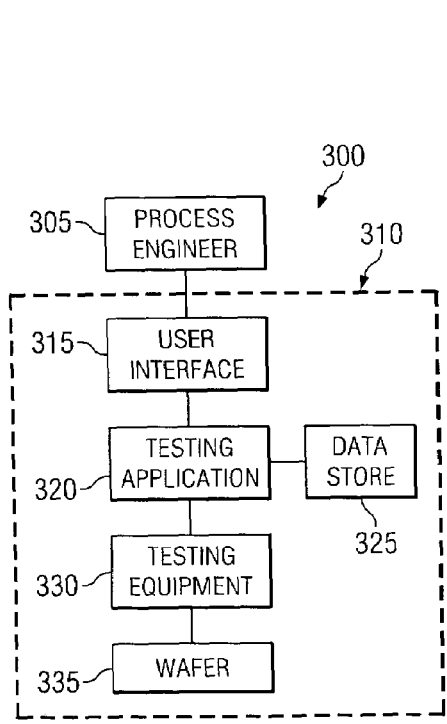
FIG. 3 is block diagram illustrating the components of a wafer acceptance test system in accordance with an embodiment of the present invention.

FIG. 3 is a block diagram illustrating a testing system 300 that may be used in WAT and wafer acceptance in accordance with an embodiment of the present invention. The testing system 300 includes a process engineer 305 who is responsible for ensuring that the wafer fabrication operates smoothly. The testing system 300 also includes a wafer acceptance testing application (WAT application) 310 that provides to the process engineer 305 information related to the WAT for a wafer that is currently being evaluated by the WAT application 310. The information provided by the WAT application 310 may include, but is not limited to, wafer status (good/bad/faulty dice/so forth), percentage of good dice, detected process fault, process fault location, various WAT and process parameters, possible remedy for detected process fault, and the like.

The WAT application 310 includes a user interface 315 that permits it to display information to the process engineer 305. The user interface 315 may also permit the process engineer 305 to provide input back to the WAT application 310. According to an embodiment of the present invention, the user interface 315 may include a display and a data input device, such as a keyboard and/or pointing device (neither shown).

A testing application 320 and data store 325 may be considered the smarts of the WAT application 310, wherein the testing application 320 evaluates test data to decide on the acceptance of a wafer 335 that is being tested. The data store 325 can serve as a data depository for previously tested wafers. Additionally, the data store 325 can be used to maintain a history of the wafers previously tested and this history can be used to help diagnose the wafer 335 being tested. A set of testing equipment 330 provides the measurement instrumentation and sensors needed to test the wafer 335.

Figure 4:
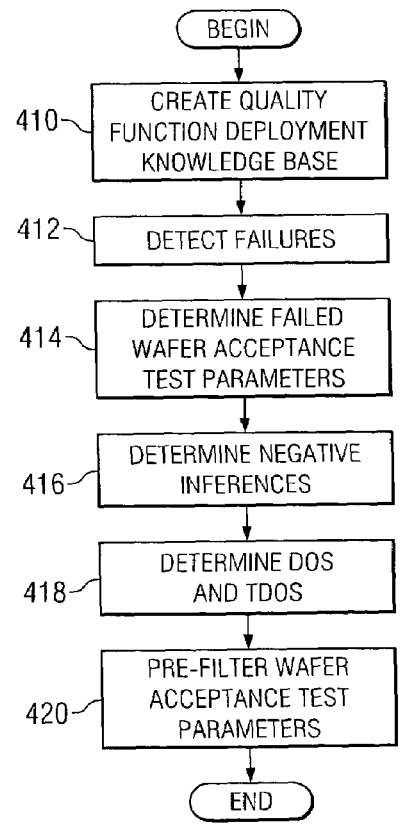
FIG. 4 is data flow diagram illustrating the process of analyzing wafer acceptance test results in accordance with an embodiment of the present invention.

FIG. 4 is a data flow diagram illustrating steps that may be performed by the testing application 320 to analyze WAT data in accordance with an embodiment of the present invention. The process begins in step 410, wherein the process engineer 305 (FIG. 3) creates a quality function deployment (QFD) knowledge base, which indicates the strength relationship between each process step and each WAT parameter, i.e., the affect of the process step on the WAT parameter. Preferably, the QFD knowledge base is implemented as a two-dimensional array utilizing a tool such as Microsoft, Inc.'s Excel spreadsheet program, wherein each row represents a WAT parameter, each column represents a process step, and the intersection thereof represents the strength relationship. An example of a QFD knowledge base is described in greater detail below with reference to FIG. 5.

The QFD knowledge base can be populated by process engineers and does not require precise numerical or statistical estimation. The process engineer associates a numerical value to each WAT parameter whose value may be affected by each process step. The numerical value represents the confidence level of the process engineer that a failed process step will affect the corresponding WAT parameter. According to a preferred embodiment of the present invention, the QFD parameters are assigned a value ranging from 0 to 5 indicating an approximate strength between the process step and the WAT parameter, with 0 being the weakest and 5 being the strongest. A different range of values, however, could be used to denote approximate strength.

For example, if a first process step significantly affects the value of a first WAT parameter, the process engineer may assign the first WAT parameter a value of 5, indicating that if the first process step fails, the value of the first WAT parameter will be greatly affected. Similarly, if the first process step only slightly affects the value of a second WAT parameter, the process engineer may assign the second WAT parameter a value of 1, indicating that if the first process step fails, then the value of second WAT parameter will only slightly be affected. If a process step does not affect a specific WAT parameter, the value associated to the process step and WAT parameter are set to a neutral value or left empty.

Optionally, the QFD knowledge base may also contain fuzzy-logic WAT parameters, providing an easier method for process engineers to express their knowledge. In some instances, it may be difficult to express an approximate strength for a particular WAT parameter. The fuzzy logic values are used to permit overlap regions and to allow process engineers to more readily express their knowledge. Generally fuzzy logic parameters are assigned ranges, such as low, medium, high, or the like with an overlap between ranges. The possible values that a WAT parameter may take are assigned to one or more of these ranges. For example, a process engineer may divide the range of values associated with a WAT parameter into three regions, low, medium, and high, wherein the regions low and medium overlap and the regions medium and high overlap. If the value of the WAT parameter is within the low region, then the WAT parameter is assigned the fuzzy logic value of "low"; if the value of the WAT parameter is within the medium region, then the WAT parameter is assigned the fuzzy logic value of "medium"; and if the value of the WAT parameter is within the high region, then the WAT parameter is assigned the value of "high."

In addition to the region, the value is preferably assigned a corresponding degree of membership (DFM). The DFM for a particular discretized fuzzy logic set member may be thought of as a confidence level in the quality of the conversion of the continuous valued variable into a discrete value.

As indicated above, the regions may overlap. When the value of the WAT parameter falls within an overlap region, the WAT parameter may be randomly placed into one of the overlapping logic sets, it may be placed into a logic set whose WAT parameter value with maximum DFM it is closer to, it may be placed in a logic set with a greater priority, and so forth.

Furthermore, the process engineer may specify a strength relationship between a process step and a combination of WAT parameters and/or fuzzy-logic WAT parameters. For example, a process engineer may specify a strength relationship between a process step and the combination of a first fuzzy WAT parameter being high and a second fuzzy WAT parameter being low.

An example of a definition of a fuzzy WAT parameter is provided below in reference to FIG. 6.

After the QFD knowledge base has been created in step 410, processing proceeds to step 412, wherein defects or failures are detected on the dice. As discussed above, dice are tested by placing probes on the dice and conducting measurements, such as measuring the amount of resistance, current, and the like between two or more points on the dice. One or more measurements are taken, and each measurement is compared to a predetermined limit. Measurements that are within the predetermined limit pass, and the measurements that are not within the predetermined limit fail. As a result of performing step 412, the WAT parameters that have failed are identified.

Processing then proceeds to step 414, wherein the suspicious process steps are identified. For each WAT parameter that failed, i.e., the value associated with the WAT parameter was not within the predetermined limit, the process steps that affect the failed WAT parameters are selected. Utilizing the two-dimensional array discussed above, this step is performed by selecting each process step, i.e., each column, that has a value in the row corresponding to the WAT parameter.

After identifying the suspicious process steps in step 414, negative inferences are determined in step 416. Whereas step 414 identifies positive inferences by identifying all process steps that affect the failed WAT parameter, step 416 identifies other WAT parameters that should have failed, but did not, if the suspicious process steps were at fault. Preferably, this step is accomplished by parsing the QFD knowledge base to identify WAT parameters with an equal or higher strength relationship value in the column associated with each of the suspicious process steps. If a WAT parameter that passed wafer acceptance testing has a higher strength value than a WAT parameter that failed, then the WAT parameter that passed is a negative inference that the particular process step failed.

Next, in step 418, the degree of suspiciousness (DOS) for each process step is determined. Generally, the DOS assigns a numerical value to each process step that accounts for positive inferences and negative inferences. Preferably, the DOS is determined by the following equation:

$$DOS = 0.5 * \left( \frac{MAX(bad\_weighting)}{5} - \frac{MAX(good\_weighting)}{5} \right) + 0.5$$

wherein
MAX(bad_weighting) is the maximum strength relationship among the failed WAT parameters affected by the selected process step; and
MAX(good_weighting) is the maximum strength relationship among the passed WAT parameters affected by the selected process step.

From the DOS, a total degree of suspiciousness (TDOS) for each process step is determined. Preferably, the TDOS for each process step is calculated in accordance with the following equation:

$$TDOS = \frac{MAX(bad\_weighting)}{5} * DOS$$

wherein
MAX(bad_weighting) is the maximum strength relationship among the failed WAT parameters affected by the selected process step; and
DOS is the degree of suspiciousness calculated for the corresponding process step as described above.

According to a preferred embodiment of the present invention, a range of values for TDOS of each process step is between zero and one, with greater suspicion being indicated by values closer to one. Note once again that the value of the constant 5 is dependent upon the permitted range of the weightings and would change if the range was to change.

Alternatively, the DOS and/or TDOS may be based upon assigning different weighting factors for negative inferences and positive inferences, incorporating the ordering of the WATs and process steps, and using different weighting factors for negative inferences than the weighting factors for positive inferences. Additionally, in an alternative embodiment, the affect of each process step on a WAT parameter may be represented by two or more strength relationships. For example, the affect of a process step on a WAT parameter may be represented by a negative inference strength relationship and a positive inference strength relationship, wherein the negative inference strength relationship value may be used to determine the bad_weighting portion of the DOS and TDOS and the positive inference strength relationship value may be used to determine the good_weigthing portion of the DOS and TDOS.

Next, in step 420, a pre-filtering mechanism is preferably applied. In some situations, more than one process failure may impact a troubled lot of wafers. Because determining a faulty process step when there are actually more than one process step failure can be quite difficult, if not impossible, it can simplify matters if the multiple process failures can be separated. Therefore, to help separate and isolate failure symptoms from the failure symptoms that may mask the failure of several process steps, a pre-filtering mechanism may be applied. The pre-filtering mechanism groups suspicious process steps into sub-groups that can be investigated further by the process engineer.

Preferably, the pre-filtering process includes a dissimilarity calculation and a clustering function. The dissimilarity value is determined between each failed WAT parameter pair for each suspicious process step. The dissimilarity value expresses a "closeness" between two WAT parameters, with a value closer to zero indicating greater "closeness." The dissimilarity can be defined by the expression:

$$D(i, j) = \sum_{k=1}^{K} |QFD(WAT_i, PROC_k) - QFD(WAT_j, PROC_k)|$$

wherein
D(i,j) is the dissimilarity between the $i^{th}$ and $j^{th}$ WAT parameter for a selected suspicious process step;
K is the number of suspicious process steps;
$WAT_i$ is the $i^{th}$ WAT parameter;
$PROC_k$ is the $k^{th}$ suspicious process step;
$QFD(WAT_i, PROC_k)$ is the strength relationship value for the $i^{th}$ WAT parameter and the $k^{th}$ suspicious process step from the QFD knowledge base;
$WAT_j$ is the $j^{th}$ WAT parameter; and
$QFD(WAT_j, PROC_k)$ is the strength relationship value for the $j^{th}$ WAT parameter and the $k^{th}$ suspicious process step from the QFD knowledge base.

To help further separate and isolate failure symptoms, clustering is preferably performed by utilizing the dissimilarity values discussed above to create WAT clusters. Clustering allows the process engineer to separate multiple events that impact individual or multiple wafers. Clustering methods generally group failures into clusters by evaluating the distance or dissimilarity between failures. For example, if two WAT parameters are affected by the same process steps, then those two WAT parameters are likely to be grouped into the same cluster. On the other hand, if two WAT parameters are affected by no process steps in common, then those two WAT parameters are not likely to be grouped into the same cluster. In case diagnosis, the process engineer can separate reasoning processes by different failure WAT clusters.

One well-known clustering method that is suitable for use in the present invention is a K-means clustering algorithm. K-means clustering is a non-hierarchical method that examines each WAT parameter and based on its value, assigns each WAT parameter to a cluster depending upon a minimum distance between each WAT parameter. K-means clustering is a clustering means that is well-known to one of ordinary skill in the art.

As a result of clustering, major failure symptoms are isolated, and minor events or isolated failure symptoms are filtered out. The process engineer is then able to evaluate the WAT clusters and the actual WAT parameters to further investigate the faulty process steps. Clustering is described further below with reference to FIG. 8.

Figures 5, 6, 7A:
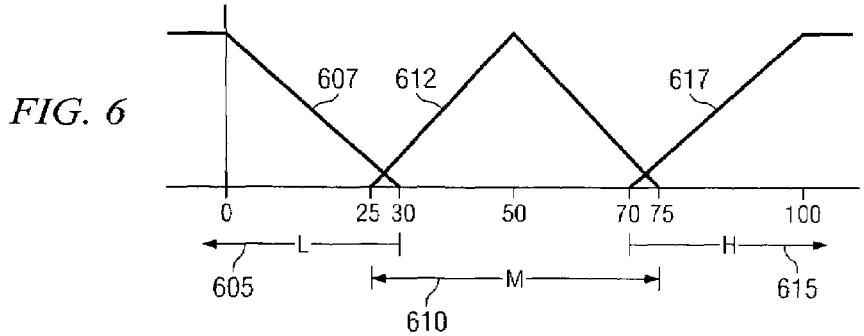
FIG. 5 is a quality function deployment knowledge base in accordance with an embodiment of the present invention.
FIG. 6 is a graph illustrating a fuzzy logic discretization process in accordance with an embodiment of the present invention.
FIGS. 7a–7c are tables illustrating the processing of analyzing wafer acceptance test results in accordance with an embodiment of the present invention.

FIG. 5 illustrates an example of a QFD knowledge base in accordance with an embodiment of the present invention. In particular, FIG. 5 illustrates an example of a QFD knowledge base as discussed above in reference to step 410 of FIG. 4 for a process having five process steps and eight WAT parameters. Accordingly, reference numeral 500 indicates a two-dimensional array, wherein columns 510–514 represent process steps 1–5 and rows 520–528 represent eight WAT parameters. Of the eight WAT parameters, row 525 represent a fuzzy WAT parameter, and rows 525 and 526 indicate combinations of fuzzy WAT parameters. The intersection of the rows and columns represent the strength relationship between the corresponding process step and WAT parameter, with 5 being the strongest and 0 being the weakest.

As discussed above, the QFD knowledge base indicates the relative affect of each process step on each WAT parameter. For example, process steps 1 and 4, indicated by reference numerals 510 and 513, respectively, affect the value of a first WAT parameter (WAT1) 520 with an approximate strength of 3 and 4, respectively. Additionally, strength relationship values between WAT1 and process steps 2, 3, and 5 are blank, indicating that process steps 2, 3, and 5 do not affect the value of WAT1. Thus, if WAT1 fails, the suspicious process steps are process step 1 and 4, and, because process steps 2, 3, and 5 do not affect WAT1, it is unlikely that the failed process step is process step 2, 3, or 5.

As discussed above, the process engineer may optionally express the effect of a failed process step utilizing fuzzy-logic WAT parameters, singularly or in combination with other WAT parameters or fuzzy WAT parameters, so that it is easier for process engineers to express their knowledge. For example, the fuzzy WAT parameter "WAT1_H & WAT2_L" 525 indicates the combination of fuzzy WAT parameter WAT1 belonging to fuzzy set H (high) and fuzzy-logic WAT parameter WAT2 belonging to fuzzy set L (low) with an approximate strength of 3 on each of process steps 1, 2, and 4. The creation of the fuzzy sets will be discussed below with reference to FIG. 6.

FIG. 6 is a graph that illustrates the creation of a discrete valued fuzzy logic set from a continuous valued variable in accordance with an embodiment of the present invention. In FIG. 6, the horizontal axis of the graph illustrates a range of values of a WAT parameter while the vertical axis illustrates a corresponding degree of membership (DFM) with respect to a fuzzy logic set. The DFM for a particular discretized fuzzy logic set member may be thought of as a confidence level in the quality of the conversion of the continuous valued variable into a discrete value.

Ranges low 605, medium 610, and high 615 represent possible discrete value fuzzy logic sets for a WAT parameter. For example, if the value of the WAT parameter is less than 30, then the WAT parameter may be placed into logic set low; if the value of the WAT parameter is greater than 25 and less than 75, then the WAT parameter may be placed into the logic medium set; and if the value of the WAT parameter is greater than 70, then the WAT parameter may be placed into the logic high set. Note that the ranges may change depending on the number of discrete logic sets and so forth.

Furthermore, a process engineer may specify that a particular fuzzy WAT parameter may have more than three discrete values. For example, there may be five discrete logic sets: low, medium-low, medium, medium-high, and high. As an example of the discretization process, using the graph displayed in FIG. 6, a WAT parameter value of close to zero (0) may be discretized to a fuzzy logic low with a high DFM, and a WAT parameter value of 24 may also be discretized to a fuzzy logic set low with a lower DFM.

Figures 7B, 7C, 8, 9:
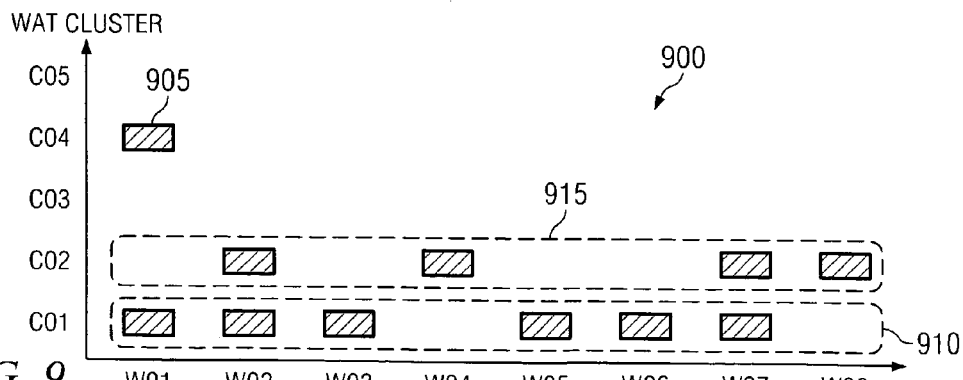
FIG. 8 is a table illustrating the clustering of wafer acceptance test parameters in accordance with an embodiment of the present invention.
FIG. 9 is a plot illustrating the distribution of wafer acceptance test clusters across multiple wafers in accordance with an embodiment of the present invention.

FIGS. 7a–7c is a series of tables illustrating a process for identifying the possible process faults in accordance with an embodiment of the present invention. In particular, FIGS. 7a–7c illustrate the process as described above with reference to 414–418 of FIG. 4. As an initial matter, FIGS. 7a–7c assume a starting QFD knowledge base similar to the QFD knowledge base illustrated in FIG. 5.

FIG. 7a illustrates the identification of suspicious process steps assuming that WAT parameters WAT1, WAT2, and WAT1_H&WAT2_L failed. Given that these WAT parameters have failed, each process step that has been identified as affecting the failed WAT parameters is a suspicious process step. Note that FIG. 7a only contains the suspicious process steps. Thus, process steps 3 and 5 have been removed because those process steps do not affect any of the failed WAT parameters, i.e., process steps 3 and 5 have been removed from FIG. 5 to create FIG. 7a.

The maximum strength relationship, indicated by reference numeral 710, is determined by identifying the highest, i.e., the strongest strength relationship for each suspicious process step. Thus, for the suspicious process steps 1, 2, and 4, the highest strength relationships of the failed WAT parameters are 3, 3, and 4, respectively.

FIG. 7b illustrates the negative inferences, i.e., the WAT parameters that indicate one or more of the suspicious process steps did not fail. As discussed above, the negative inferences are determined by selecting the WAT parameters that passed wafer acceptance testing and that have a strength relationship value equal to or greater than the maximum strength relationship among the failed WAT parameters for each process step. For example, the strength relationship between WAT parameter WAT3 and process step 1 is 4, which is greater than the maximum strength relationship of the failed WAT parameters, i.e., 3, for process step 1, and thus, WAT3 is a negative inference that process step 1 failed. In other words, WAT3 implies that the defective process step is not process step 1 because if process step 1 was the defective step, it is likely that WAT parameter WAT3 would have also failed. Similarly, WAT parameter WAT4 is a negative inference that process step 2 caused the failure because WAT4 has a strength relationship of 3, which is equal to or greater than the maximum strength relationship of the failed WAT parameters. Note that WAT parameter WAT5 is not a negative inference for process step 4 because the strength relationship between WAT5 and process step 4 is less than the maximum strength relationship between the failed WAT parameters and process step 4.

FIG. 7c illustrates the calculation of the DOS and TDOS in accordance with the equations discussed above. According to a preferred embodiment of the present invention, a range of values for a process step's degree of total suspiciousness is between zero and one, with greater suspicion being indicated by values closer to one.

FIG. 8 illustrates an example of clustering WAT parameters using a K-means clustering method in accordance with an embodiment of the present invention. As discussed above, clustering helps to separate and isolate failure symptoms.

Accordingly, table 800 displays various WAT parameters along the vertical axis and process steps along the horizontal axis, with the impact of the process step on the WAT parameter being stored in the individual cells. The application of the K-means clustering method has created two WAT clusters, WAT cluster C01 815 and C02 820, with WAT cluster C01 815 including WAT parameters WAT1 and WAT2, and WAT cluster C02 820 including WAT parameters WAT3 and WAT4.

FIG. 9 is a plot illustrating the effect of clustering with respect to a group of wafers in accordance with an embodiment of the present invention. Plot 900 illustrates a clustering plot wherein the vertical axis represents the various clusters that have been created as discussed above, and the horizontal axis represents the various wafers. In this case, the WAT parameters have been clustered into five clusters C01–C05. The failed wafers along the horizontal axis include wafers W01–W08. As illustrated in FIG. 9, the majority of failed WAT parameters are members of clusters C01 910 and C02 915. The failure 905 of WAT cluster C04 on wafer W01 is likely a false reading, the true error in the process being caused by one of the process steps associated with WAT cluster W01.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of detecting suspicious process faults, the method comprising the steps of:
    creating a quality function deployment (QFD) knowledge base, the QFD knowledge base representing a strength relationship between at least one wafer acceptance test (WAT) parameter and at least one process step;
    detecting at least one failed WAT parameter;
    identifying using the QFD knowledge base at least one suspicious process step as the process step affecting the failed WAT parameter;
    determining at least one negative inference for each suspicious process step, the determining being performed at least in part by identifying one or more WAT parameters that passed, but should have failed if the respective suspicious step failed; and
    calculating a total degree of suspiciousness for each suspicious process step based at least in part on the negative inference.

2. The method of claim 1, wherein the total degree of suspiciousness is based at least in part on the equation:

$$TDOS = \frac{\text{MAX(bad\_weighting)}}{5} * DOS,$$

wherein
    MAX(bad_weighting) is the maximum strength relationship among the failed WAT parameters affected by each suspicious process step; and
    DOS is the degree of suspiciousness.

3. The method of claim 2, wherein the degree of suspiciousness is based at least in part on the equation:

$$DOS = 0.5 * \left( \frac{\text{MAX(bad\_weighting)}}{5} - \frac{\text{MAX(good\_weighting)}}{5} \right) + 0.5,$$

wherein
    MAX(bad_weighting) is the maximum strength relationship among the failed WAT parameters affected by the selected process step; and
    MAX(good_weighting) is the maximum strength relationship among the passed WAT parameters affected by the selected process step.

4. The method of claim 1, further comprising the step of clustering the failed WAT parameters into one or more clusters to separate and isolate failure symptoms.

5. The method of claim 4, wherein the clusters are based at least in part on the dissimilarity between WAT parameters, the dissimilarity being based at least in part on the equation:

$$D(i, j) = \sum_{k=1}^{K} |QFD(WAT_i, PROC_k) - QFD(WAT_j, PROC_k)|,$$

wherein
    $D(i,j)$ is the dissimilarity between the $i^{th}$ and $j^{th}$ WAT parameter for a suspicious process step;
    K is the number of suspicious process steps;
    $WAT_i$ is the $i^{th}$ WAT parameter;
    $PROC_k$ is the $k^{th}$ suspicious process step;
    $QFD(WAT_i, PROC_k)$ is the strength relationship value for the $i^{th}$ WAT parameter and the $k^{th}$ suspicious process step from the QFD knowledge base;
    $WAT_j$ is the $j^{th}$ WAT parameter; and
    $QFD(WAT_j, PROC_k)$ is the strength relationship value for the $j^{th}$ WAT parameter and the $k^{th}$ suspicious process step from the QFD knowledge base.

6. The method of claim 5, wherein the step of clustering is performed by K Means clustering.

7. The method of claim 1, wherein the step of determining negative inferences includes determining at least one passed WAT parameter having a higher strength relationship for the suspicious process step.

8. The method of claim 1, wherein the QFD is represented by a two-dimensional array.

9. A method of identifying a process step that has caused a failed wafer acceptance test (WAT), the method comprising:
    performing a series of wafer acceptance tests (WATs) on a wafer;
    for each failed WAT;
        identifying those process steps having a positive inference, the positive inference being the correlation between the respective process steps and the failed WAT;
        for each process step having a positive inference, computing a negative inference, the negative inference being the respective correlation between each process step and at least one non-failed WAT that should have failed if the respective process step had failed; and
        determining a total degree of suspiciousness from the positive and negative inferences; and
    identifying one or more process steps that are most likely to have caused the failed WAT, based at least in part upon the total degree of suspiciousness.

10. The method of claim 9, wherein the total degree of suspiciousness is based at least in part on the equation:

$$TDOS = \frac{MAX(bad\_weighting)}{5} * DOS,$$

wherein
MAX(bad_weighting) is the maximum strength relationship among the failed WAT parameters affected by each suspicious process step; and
DOS is the degree of suspiciousness.

11. The method of claim 10, wherein the degree of suspiciousness is based at least in part on the equation:

$$DOS = 0.5 * \left(\frac{MAX(bad\_weighting)}{5} - \frac{MAX(good\_weighting)}{5}\right) + 0.5,$$

wherein
MAX(bad_weighting) is the maximum strength relationship among the failed WAT parameters affected by the selected process step; and
MAX(good_weighting) is the maximum strength relationship among the passed WAT parameters affected by the selected process step.

12. The method claim 9, further comprising the step of clustering the failed WAT parameters into one or more clusters to separate and isolate failure symptoms.

13. The method of claim 12, wherein the clusters are based at least in part on the dissimilarity between WAT parameters, the dissimilarity being based at least in part on the equation:

$$D(i, j) = \sum_{k=1}^{K} |QFD(WAT_i, PROC_k) - QFD(WAT_j, PROC_k)|,$$

wherein
D(i,j) is the dissimilarity between the $i^{th}$ and $j^{th}$ WAT parameter for a suspicious process step;
K is the number of suspicious process steps;
$WAT_i$ is the $i^{th}$ WAT parameter;
$PROC_k$ is the $k^{th}$ suspicious process step;
$QFD(WAT_i, PROC_k)$ is the strength relationship value for the $i^{th}$ WAT parameter and the $k^{th}$ suspicious process step from the QFD knowledge base;
$WAT_j$ is the $j^{th}$ WAT parameter; and
$QFD(WAT_j, PROC_k)$ is the strength relationship value for the $j^{th}$ WAT parameter and the $k^{th}$ suspicious process step from the QFD knowledge base.

14. The method of claim 12, wherein the step of clustering is performed by K Means clustering.

15. The method of claim 9, wherein the step of computing negative inferences includes determining at least one passed WAT parameter having a higher strength relationship for the suspicious process step.

16. The method of claim 9, wherein the QFD is represented by a two-dimensional array.

17. A computer program product for detecting suspicious process faults, the computer program product having a medium with a computer program embodied thereon, the computer program comprising:
computer program code for creating a quality function deployment (QFD) knowledge base, the QFD knowledge base representing a strength relationship between at least one wafer acceptance test (WAT) parameter and at least one process step;
computer program code for detecting at least one failed WAT parameter;
computer program code for identifying using the QFD knowledge base suspicious process steps as the process steps affecting the failed WAT parameter;
computer program code for determining negative inferences for each suspicious process step, the determining being performed at least in part by identifying one or more WAT parameters that that passed, but should have failed if the respective suspicious step failed; and
computer program code for calculating a total degree of suspiciousness for each suspicious process step based at least in part on the negative inferences.

18. The computer program product of claim 17, wherein the total degree of suspiciousness is based at least in part on the equation:

$$TDOS = \frac{MAX(bad\_weighting)}{5} * DOS,$$

wherein
MAX(bad_weighting) is the maximum strength relationship among the failed WAT parameters affected by each suspicious process step; and
DOS is the degree of suspiciousness.

19. The computer program product of claim 18, wherein the degree of suspiciousness is based at least in pad on the equation:

$$DOS = 0.5 * \left(\frac{MAX(bad\_weighting)}{5} - \frac{MAX(good\_weighting)}{5}\right) + 0.5,$$

wherein
MAX(bad_weighting) is the maximum strength relationship among the failed WAT parameters affected by the selected process step; and
MAX(good_weighting) is the maximum strength relationship among the passed WAT parameters affected by the selected process step.

20. The computer program product of claim 17, further comprising computer program code for clustering the failed WAT parameters into one or more clusters to separate and isolate failure symptoms.

21. The computer program product of claim 20, wherein the clusters are based at least in part on the dissimilarity between WAT parameters, the dissimilarity being based at least in part on the equation:

$$D(i, j) = \sum_{k=1}^{K} |QFD(WAT_i, PROC_k) - QFD(WAT_j, PROC_k)|,$$

wherein
D(i,j) is the dissimilarity between the $i^{th}$ and $j^{th}$ WAT parameter for a suspicious process step;
K is the number of suspicious process steps;
$WAT_i$ is the $i^{th}$ WAT parameter;
$PROC_k$ is the $k^{th}$ suspicious process step;

QFD(WAT$_i$,PRO$_k$) is the strength relationship value for the i$^{th}$ WAT parameter and the k$^{th}$ suspicious process step from the QFD knowledge base;

WAT$_j$ is the j$^{th}$ WAT parameter; and

QFD(WAT$_j$,PROC$_k$) is the strength relationship value for the j$^{th}$ WAT parameter and the k$^{th}$ suspicious process step from the QFD knowledge base.

22. The computer program product of claim 21, wherein computer program code for clustering uses a K-Means clustering algorithm.

23. The computer program product of claim 17, wherein the computer program code for determining negative inferences includes computer program code for determining at least one passed WAT parameter having a higher strength relationship for the suspicious process step.

24. The computer program product of claim 17, wherein the QFD is represented by a two-dimensional array.

25. A computer program product for identifying a process step that has caused a failed wafer acceptance test (WAT), the computer program product having a medium with a computer program embodied thereon, the computer program comprising:

computer program code for performing a series of wafer acceptance tests (WATs) on a wafer;

for each failed WAT;

computer program code for identifying those process steps having a positive inference, the positive inference being the correlation between the respective process steps and the failed WAT;

for each process step having a positive inference, computer program code for computing a negative inference, the negative inference being the respective correlation between each process step and at least one non-failed WAT that should have failed if the respective process step had failed; and computer program code for determining a total degree of suspiciousness from the positive and negative inferences; and computer program code for identifying one or more process steps that are most likely to have caused the failed WAT, based at least in part upon the total degree of suspiciousness.

26. The computer program product of claim 25, wherein the total degree of suspiciousness is based at least in part on the equation:

$$TDOS = \frac{\text{MAX(bad\_weighting)}}{5} * DOS,$$

wherein

MAX(bad_weighting) is the maximum strength relationship among the failed WAT parameters affected by each suspicious process step; and DOS is the degree of suspiciousness.

27. The computer program product of claim 26, wherein the degree of suspiciousness is based at least in part on the equation:

$$DOS = 0.5 * \left( \frac{\text{MAX(bad\_weighting)}}{5} - \frac{\text{MAX(good\_weighting)}}{5} \right) + 0.5,$$

wherein

MAX(bad_weighting) is the maximum strength relationship among the failed WAT parameters affected by the selected process step; and MAX(good_weighting) is the maximum strength relationship among the passed WAT parameters affected by the selected process step.

28. The computer program product of claim 25, further comprising computer program code for clustering the failed WAT parameters into one or more clusters to separate and isolate failure symptoms.

29. The computer program product of claim 28, wherein the clusters are based at least in part on the dissimilarity between WAT parameters, the dissimilarity being based at least in part on the equation:

$$D(i, j) = \sum_{k=1}^{K} |QFD(WAT_i, PROC_k) - QFD(WAT_j, PROC_k)|,$$

wherein

D(i,j) is the dissimilarity between the i$^{th}$ and j$^{th}$ WAT parameter for a suspicious process step;

K is the number of suspicious process steps;

WAT$_i$ is the i$^{th}$ WAT parameter;

PROC$_k$ is the k$^{th}$ suspicious process step;

QFD(WAT$_i$,PROC$_k$) is the strength relationship value for the i$^{th}$ WAT parameter and the k$^{th}$ suspicious process step from the QFD knowledge base;

WAT$_j$ is the j$^{th}$ WAT parameter; and

QFD(WAT$_j$,PROC$_k$) is the strength relationship value for the j$^{th}$ WAT parameter and the k$^{th}$ suspicious process step from the QFD knowledge base.

30. The computer program product of claim 28, wherein the computer program code for clustering performs K-Means clustering algorithm.

31. The computer program product of claim 25, wherein the computer program code for computing negative inferences includes computer program code for determining at least one passed WAT parameter having a higher strength relationship for the suspicious process step.

32. The computer program product of claim 25, wherein the QFD is represented by a two-dimensional array.

* * * * *

UNITED STATES PATENT AND TRADEMARK OFFICE
CERTIFICATE OF CORRECTION

PATENT NO. : 7,035,770 B2
APPLICATION NO. : 10/739857
DATED : April 25, 2006
INVENTOR(S) : Lin et al.

Page 1 of 1

It is certified that error appears in the above-identified patent and that said Letters Patent is hereby corrected as shown below:

In Col. 12, line 32, delete "$QFD(WAT_j, PROC_k)$" and insert --$QFD(WAT_i, PROC_k)$--

In Col. 14, line 32, delete "pad" and insert --part--

Signed and Sealed this

Thirtieth Day of January, 2007

JON W. DUDAS
*Director of the United States Patent and Trademark Office*